United States Patent
Bechtel et al.

(10) Patent No.: US 7,943,950 B2
(45) Date of Patent: May 17, 2011

(54) STRUCTURED SUBSTRATE FOR A LED

(75) Inventors: Hans-Helmut Bechtel, Roetgen (DE); Wolfgang Busselt, Roetgen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 729 days.

(21) Appl. No.: 11/911,030

(22) PCT Filed: Apr. 6, 2006

(86) PCT No.: PCT/IB2006/051050
§ 371 (c)(1), (2), (4) Date: Oct. 9, 2007

(87) PCT Pub. No.: WO2006/109222
PCT Pub. Date: Oct. 19, 2006

(65) Prior Publication Data
US 2008/0203421 A1    Aug. 28, 2008

(30) Foreign Application Priority Data
Apr. 13, 2005 (EP) .................... 05102912

(51) Int. Cl.
*H01L 33/00* (2010.01)
(52) U.S. Cl. .......................... 257/99; 257/98
(58) Field of Classification Search .......... 257/99, 257/98
See application file for complete search history.

(56) References Cited

U.S. PATENT DOCUMENTS

| | | | |
|---|---|---|---|
| 7,312,570 B2 * | 12/2007 | Shiang et al. | ................ 313/506 |
| 2003/0122480 A1 | 7/2003 | Wei et al. | |
| 2003/0127654 A1 | 7/2003 | Eisert et al. | |
| 2004/0104672 A1 | 6/2004 | Shiang et al. | |

FOREIGN PATENT DOCUMENTS

| | | |
|---|---|---|
| DE | 10234977 A1 | 2/2004 |
| EP | 0969699 A1 | 1/2000 |
| EP | 1263058 A2 | 12/2002 |
| EP | 1462828 A2 | 9/2004 |
| EP | 1667241 A1 | 6/2006 |
| JP | 10093136 A1 | 4/1998 |
| WO | 9857525 A1 | 12/1998 |
| WO | 0124280 A1 | 4/2001 |
| WO | 2004017106 A1 | 2/2004 |
| WO | 2004017430 A1 | 2/2004 |

OTHER PUBLICATIONS

S. Tanaka, et al: Improvement of the External Extraction Efficiency of OLED by using a Pyramid Array, vol. 5519, Proc. SPIE, 2004, pp. 184-193.

* cited by examiner

*Primary Examiner* — Douglas M Menz

(57) ABSTRACT

A substrate (1) made of a transparent material, preferably glass, which substrate has a planar first side (1a) for the application of an electroluminescent layered structure (21, 22, 23) for emitting light and having a structured second side (1b) for the effective coupling-out of light (6), comprising at least one element of structure (2) comprising first regions (3) having first surfaces (3a) that have a surface roughness of between 0.2 μm and 100 μm, and preferably of between 0.4 μm and 70 μm, and as a particular preference of between 0.7 μm and 40 μm.

9 Claims, 5 Drawing Sheets

STRUCTURED SUBSTRATE FOR A LED

The invention relates to electroluminescent light sources and to structured transparent substrates for improving the coupling-out of light.

Electroluminescent light sources (EL light sources) comprising a plurality of thin layers (the EL layered structure) and having an electroluminescent layer (EL layer) for emitting light are known. In what are termed bottom emitters, the light reaches the observer through a transparent substrate. When the light leaves the EL layered structure, there is a transition from an optically denser medium (a transparent substrate having a refractive index $n_2 > 1$) into an optically less dense medium (air having a refractive index $n_1 = 1$). The angle of incidence of the light and its angle of emergence (also termed the angle of incidence on the second medium) are determined by the law of refraction. If the light is incident on the interface between the substrate and the air at an angle greater than the critical angle $\alpha = \sin^{-1}(n_1/n_2)$, it is not coupled out of the EL device but is totally reflected (causing coupling-out losses). The angle of incidence of the light and its angle of emergence (or its angle of incidence on a succeeding layer) are, in this case, the angle between the direction of propagation of a ray of light and a perpendicular to the interface concerned, or what is also termed below a line normal to the layer. Normal transparent substrates have refractive indexes of between 1.45 and 2.4 and this, in planar structures, results in a proportion of the light being totally reflected and hence in the light yield (the ratio between the amount of light coupled out of the EL light source and the amount of light generated in it) being considerably reduced.

Document D1 "Improvement of the external extraction efficiency of OLED by using a pyramid array", Proc. SPIE 5519, p. 184-193 (2004) discloses the improvement of the coupling-out of light by means of various surface structures, such as for example dome-shaped, pyramidal and conical structures, at the interface that the structures, which are applied to the substrate in the form of an additional layer, have with the air. The best results were obtained with a pyramidal structure having a square base, with the height of the pyramid being equal to half the length of a side of the base. The assumption on which the calculations were based was that the EL layered structure was perfectly (100%) reflective. However, in practice it is found that a large part of the theoretical gain in efficiency in the coupling-out of light cannot be obtained because in actual EL layered structures the reflectivity is less than 100%. Light that is emitted in the forward direction, and that would thus normally have left the OLED light source directly, is reflected back again by the above coupling-out structures and may thus be absorbed even in the active layers of the OLED itself (and particularly in the cathode). This can be seen from, for example, pyramidal structures that form an ideal reflector for perpendicularly emitted light and in the case of which the light is unable to leave the EL light source. For other rays of light the reflection at the pyramidal structures is so great that a plurality of reflections take place (which means that there is a correspondingly high probability of absorption). In theory, pyramidal structures can be expected to improve the coupling-out of light (and hence the light yield) but, where there are severe absorption losses in actual EL layered structures, this theoretical improvement may even result in a lower light yield than from planar substrates. The light yield of the order of 20%-26% that is achieved with current EL light sources is unsatisfactory.

It is therefore an object of the present invention to obtain an improved light yield from an electroluminescent light source having a reflectivity of less than 100%.

This object is achieved by a substrate made of a transparent material, preferably glass, which substrate has a planar first side for the application of an electroluminescent layered structure for emitting light, and a structured second side for the effective coupling-out of light comprising at least one element of structure comprising first regions having first surfaces that have a surface roughness of between 0.2 μm and 100 μm, and preferably of between 0.4 μm and 70 μm, and as a particular preference of between 0.7 μm and 40 μm. Rays of light that have been reflected back at a rough surface have, after the total reflection, a direction of propagation in the substrate that varies greatly locally. There is therefore a high probability that the light that is initially reflected back will be coupled out of the EL light source after a small number of reflections at the EL layered structure. On the one hand it is crucial in this case that the roughness is equal to at least approximately half the wavelength of the light that is to be coupled out, so that the light is able to be conscious of the roughness of the surface. On the other hand, the roughness cannot be too great because, if it were, the orientation of the surface would not vary to a sufficiently great extent in a local region to ensure that the reflected light, when it again struck the surface, reached a region of the surface that had a different local orientation and there was thus a high probability of the light being coupled out.

Also, for substrates having refractive indexes higher than those of the layers for coupling out light, the surface structure produced in the substrate prevents there from being an additional interface with an additional applied structure for coupling out light, which interface would cause total reflection. A smaller number of interfaces of this kind has a beneficial effect on the light yield. At the same time, any processes for applying layers for coupling out light to a planar substrate, and hence possible production faults such as for example unclean interfaces, particle inclusions, or the parting of layers occurring in the course of the ongoing operation of the EL light source, are avoided.

In a preferred embodiment, the elements of structure comprise second regions having a second surface substantially parallel to the first side of the substrate, and first regions which, looking in the direction in which light is coupled out, taper. The tapering regions boost direct coupling-out of that part of the light that is coupled into the substrate at its planar first side at high angles of incidence. What is achieved by the surface roughness of the first regions is that a part of the light having low angles of incidence that also reaches the first surface of the first regions is reflected in such a way that it is able to emerge directly from the second side of the substrate at the first or second surfaces.

It is advantageous in this case if the sum of the areas of all the second surfaces is between 10% and 70% of the area of the first side of the substrate. This makes it possible for a high proportion of the light that enters the substrate at low angles of incidence to be coupled directly out of the substrate into the air.

For the coupling-out of light, it is also advantageous if the first surfaces of the tapering first regions are at an angle of between 20 and 70° to the first side of the substrate.

It is particularly advantageous if the elements of structure are arranged in a cyclically repetitive pattern and if the centers of adjoining elements of structure are at a spacing of between 0.1 mm and 5 times the thickness of the substrate and preferably between 0.5 mm and 1 times the thickness of the substrate.

In a particularly preferred embodiment, the structural elements comprise a pyramid, preferably in the form of a truncated pyramid. When the EL layered structure has ideal reflectivity, a pyramid constitutes a very effective coupling-out structure. The disadvantages of an EL layered structure that is not 100% reflective are at least appreciably reduced by the surface roughness of at least the first surfaces.

It is very particularly preferred for the element of structure to comprise a third region having a third surface substantially perpendicular to the first side of the substrate, preferably having a surface roughness of between 0.2 µm and 100 µm, and as a particular preference of between 0.4 µm and 70 µm, and as a very particular preference of between 0.7 µm and 40 µm. An element of structure of this kind constitutes a light guide in the direction of propagation of the light. There is a high probability that, in the element of structure, the light that is totally reflected at the third surfaces will strike again at the surface of the second side of the substrate and will therefore be coupled out with increased effectiveness.

The invention also relates to an electroluminescent light source having at least one substrate as claimed in claim 1 and, arranged on the substrate, a plurality of layers comprising two electrodes, of which at least one electrode is transparent, for applying a voltage, and at least one electroluminescent layer for emitting light, which electroluminescent layer is arranged between the two electrodes, the transparent electrode being arranged between the substrate and the electroluminescent layer.

In a preferred embodiment, the substrate has a refractive index n of 1.4<n<3 and preferably of 1.4<n<2. In this way, at least the major proportion of the light that passes through the transparent electrode will be coupled out into the substrate.

In a particularly preferred embodiment, the refractive index of the substrate is higher than the refractive index of the transparent electrode. At the interface between an optically denser medium (the substrate) and an optically less dense medium (the transparent electrode), the light that is scattered and totally reflected by the second side of the substrate at high angles to the first side of the substrate undergoes total reflection and is thus not at any risk of being absorbed by the EL layered structure.

The invention also relates to a method of producing a substrate as claimed in claim 1, comprising the steps of
  producing depressions of a surface roughness of between 0.2 µm and 100 µm, and preferably of between 0.4 µm and 70 µm, and as a particular preference of between 0.7 µm and 40 µm, having side faces substantially perpendicular to the first side of the substrate, by means of a suitable sawing, milling or grinding process,
  widening the depressions by means of a suitable sawing, milling or grinding process to produce first regions having first surfaces of a surface roughness of between 0.2 µm and 100 µm, and preferably of between 0.4 µm and 70 µm, and as a particular preference of between 0.7 µm and 40 µm.

It is advantageous in this case if the widening of the depressions by a suitable sawing, milling or grinding process produces first regions which taper, looking in the direction in which light is coupled out, and second regions having a second surface that is substantially parallel to the planar first side of the substrate.

It is particularly advantageous if, by means of a suitable sawing, milling or grinding process, a surface roughness of between 0.2 µm and 100 µm, and preferably of between 0.4 µm and 70 µm, and as a particular preference of between 0.7 µm and 40 µm is produced on the second surface.

These and other aspects of the invention are apparent from and will be elucidated with reference to the embodiments described hereinafter.

Figure 1:
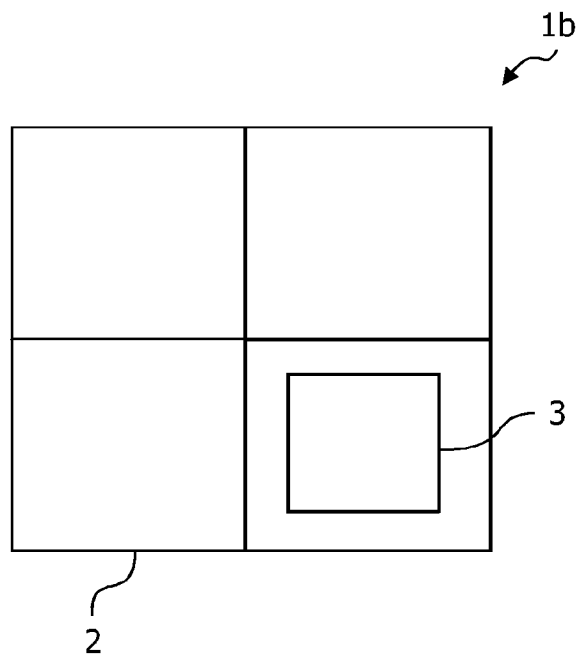
FIG. 1 is a plan view of a substrate according to the invention.

FIG. 1 is a plan view of a substrate 1 according to the invention having a structured side 1b for the effective coupling-out of light. The planar other side 1a of the substrate for the application of an electroluminescent layered structure for emitting light is not shown in this case. The structured second side 1b of the substrate comprises in this case at least one element of structure 2 that comprises first regions 3 having a first surface having a surface roughness of between 0.2 µm and 100 µm, and preferably of between 0.4 µm and 70 µm, and as a particular preference of between 0.7 µm and 40 µm. Rays of light that are reflected back at a rough surface have, after the reflection, a direction of propagation in the substrate 1 that varies widely locally. There is therefore a high probability that the light that is initially reflected back will be coupled out of the substrate 1 at the second side 1b thereof after a small number of reflections at the EL layered structure and/or at the first side 1a of the substrate. On the one hand it is crucial in this case that the roughness is equal to at least half the wavelength of the light that is coupled out, so that the light is able to be conscious of the roughness of the surface. On the other hand, the roughness cannot be too high because, if it is, the orientation of the surface will not vary to a sufficiently great extent in a local region to ensure that the reflected light, when it again strikes the surface, will reach a region of the surface that will, with a high probability, have a local orientation different than when the light struck previously and there will thus be a high probability of the light being coupled out.

The embodiment having a substrate whose second side 1b comprises an element of structure 2 of only one type having only one first region 3 having a surface of a surface roughness according to the invention (a substrate having an entirely rough second side) is expressly covered as well by the claims. Embodiments having an element of structure 2 of more than one type may comprise regular and/or irregular shapes at first regions 3. It is also possible for, for example, a plurality of first regions 3 to be arranged in an element of structure 2.

For the coupling of light out of the substrate 1 from the second side 1b of the substrate, it is advantageous if the elements of structure 2 comprise second regions 4 having a second surface 4a (see FIG. 3) substantially parallel to the first side 1a of the substrate and if the first regions 3 taper in the direction 6 in which light is coupled out. The tapering regions 3 boost the direct coupling-out of that proportion of the light that is coupled into the substrate 1 at high angles of incidence on the planar first side 1a of the substrate. What is achieved by the surface roughness of the first regions 3 is that a proportion of the light at low angles of incidence that also reaches the first surface 3a of the first regions 3 is reflected in such a way that it is able to emerge directly from the second side 1b of the substrate at the first surfaces 3a or second surfaces 4a. It is advantageous in this case if the first surfaces 3a of the tapering first regions 3 are at an angle of between 20 and 70° to the first side 1a of the substrate. The first surfaces 3a may take the form of straight surfaces or curved surfaces. When the surfaces are curved, the angle in the range specified is to be understood as the angle between the tangent to the surface and the first side 1a of the substrate.

Figure 2:
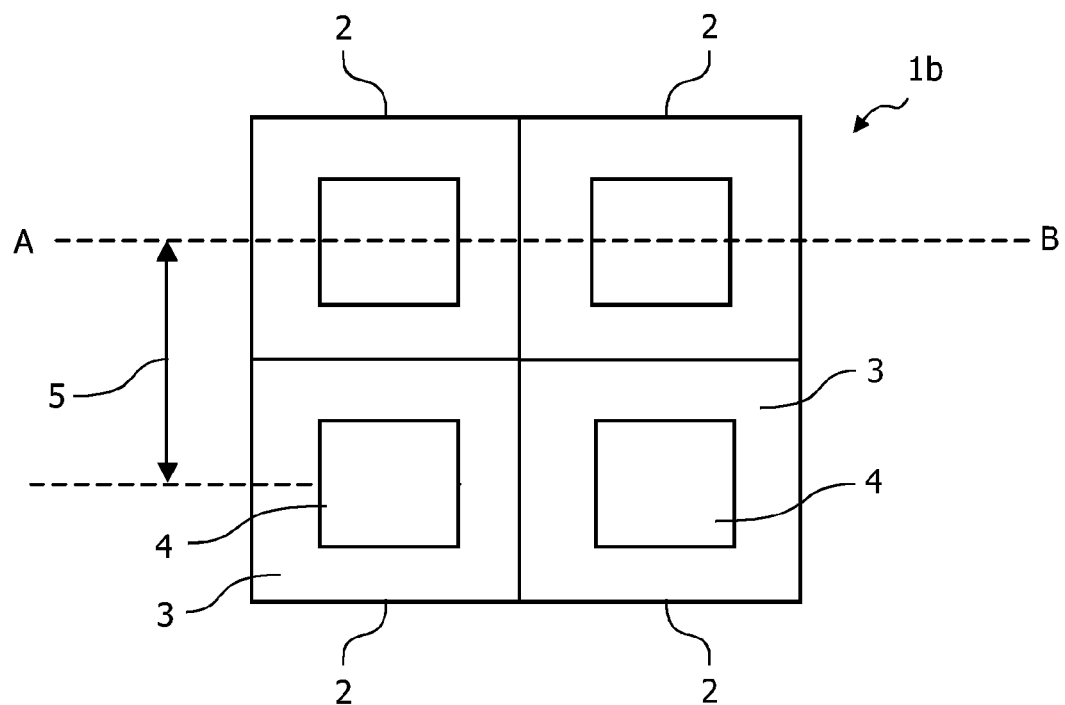
FIG. 2 is a plan view of a substrate according to the invention having two regions, showing a plane of section A-B.

It is even more advantageous if the sum of the area of all the surfaces 4a is between 10% and 70% of the area of the first side 1a of the substrate. This makes it possible for a high proportion of the light entering the substrate 1 at low angles of incidence to be coupled directly out of the substrate 1 and into the air. It is not absolutely essential in this case for the second surfaces 4a to be arranged strictly parallel to the first side 1a of the substrate. For light that propagates in these directions, it is enough if the second surfaces 4a are arranged substantially parallel to the first side 1a of the substrate. FIG. 2 shows by way of example a substrate 1 of this kind according to the invention, in the form of a plan view of the second side 1b of the substrate on which there are a plurality of square elements of structure 2 arranged in a cyclically repetitive pattern. The centers of adjacent elements of structure 2 are arranged in this case at an advantageous spacing 5 of between 0.1 mm and 5 times the thickness of the substrate, and preferably of between 0.5 mm and 1 times the thickness of the substrate, and as a particular preference of between 0.6 mm and 0.8 times the thickness of the substrate. The dashed line A-B defines the plane of section A-B on which the subsequent side views (FIGS. 3-9) of substrates 1 according to the invention are taken.

However, in other embodiments elements of structure 2 may also be of other shapes, being for example triangles, rectangles or hexagonal areas. Similarly, the second side 1b of the substrate may also comprise elements of structure 2 of different shapes.

Figure 3:
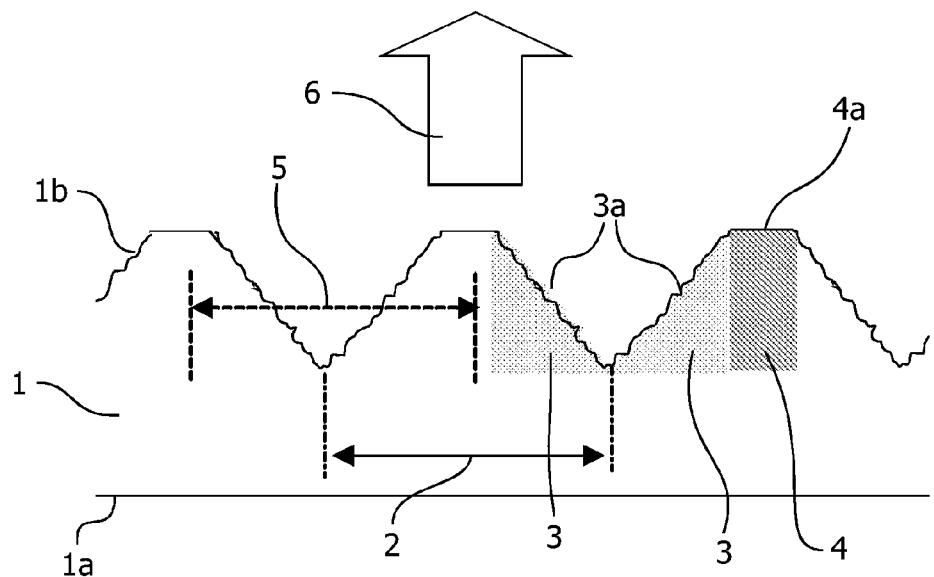
FIG. 3 is a side view, in section on plane of section A-B in FIG. 2, of a substrate according to the invention.

FIG. 3 is a side view in section of a substrate 1 according to the invention on plane of section A-B in FIG. 2. In the embodiment shown, the elements of structure 2 are in the form of truncated pyramids arranged in a cyclically repetitive pattern. The element of structure 2 extends in this case between the two dotted and dashed lines shown in FIG. 3. The spacing 5 between the centers of adjoining elements of structure 2 is indicated by a dashed line ending in arrowheads. The first regions 3, which have a rough first surface 3a and which taper in the direction 6 in which light is coupled out, are shown hatched with dots and the second regions 4, which have a second surface 4a parallel to the first side (1a) of the substrate, are shown hatched with straight lines. Where the EL layered structure is of ideal reflectivity, a pyramid represents a very effective structure for coupling-out. The disadvantages of an EL layered structure that is not 100% reflective are compensated for by the surface roughness of at least the first surfaces 3a. In contrast to pointed pyramids, the embodiment shown in FIG. 3 in the form of a truncated pyramid having an advantageous proportion of second surfaces 4a parallel to the first side 1a of the substrate causes, in addition, increased coupling-out of any light whose direction of propagation is substantially in the direction 6 in which light is coupled out. However, in other embodiments the elements of structure 2 may also comprise other three-dimensional bodies.

Figure 4:
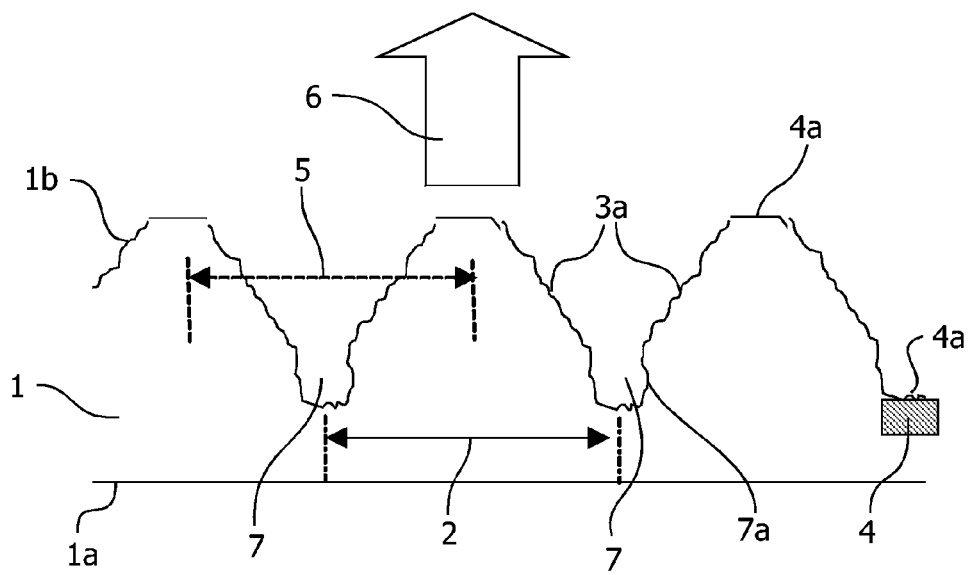
FIG. 4 is a side view, in section on plane of section A-B in FIG. 2, of a substrate according to the invention having three regions.

In addition to the elements of structure shown in FIG. 3, the elements of structure 2 of the embodiment according to the invention shown in FIG. 4 comprise third regions 7 having a third surface 7a substantially perpendicular to the first side 1a of the substrate. Adjoining third regions 7 are separated from one another in this case by a second region 4, having a second surface 4a which need not necessarily be strictly parallel to the first side 1a of the substrate. These second surfaces 4a which, when looking in the direction 6 in which light is coupled out, are arranged below the first surfaces 3a, may take the form of rough surfaces according to the invention. Those second surfaces 4a which, when looking in the direction 6 in which the light is coupled out, are arranged above the first surfaces 3a, may have smooth surfaces in this case and/or rough surfaces according to the invention. The perpendicular third surfaces 7a may have a rough surface according to the invention.

An element of structure 2 as shown in FIG. 4 constitutes a light guide in the direction 6 in which the light is coupled out. There is a high probability that the light that is totally reflected at the third surfaces 7a will, in the element of structure 2, strike again at first, second and/or third surfaces on the second side 1b of the substrate and will therefore be coupled out in a highly effective way. For a light guide of this kind, it is not absolutely essential for the third surfaces 7a to be arranged strictly perpendicular to the first side 1a of the substrate. It is enough if the third surfaces 7a are at a sufficiently different angle to the first side 1a of the substrate than the first surfaces 3a.

Figure 5:
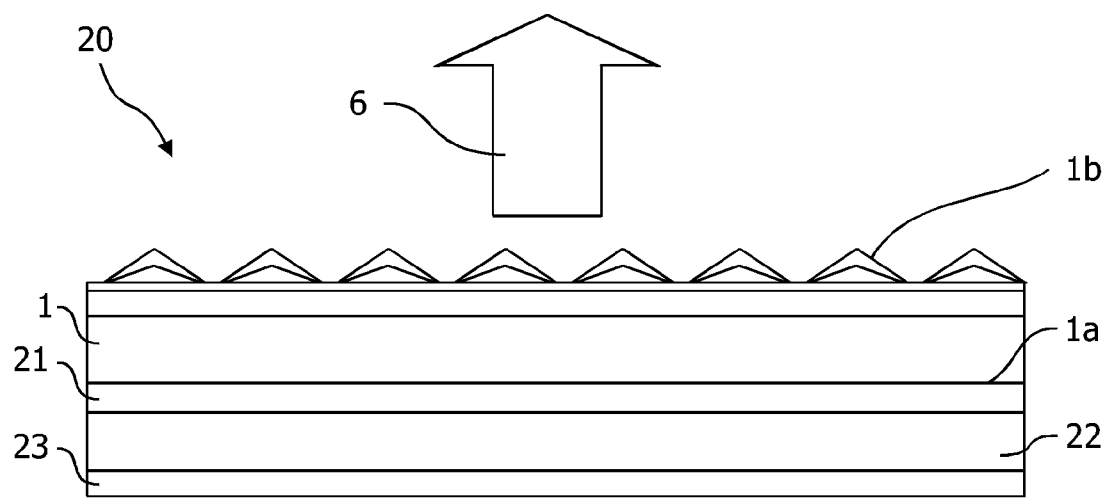
FIG. 5 is a side view of an electroluminescent light source according to the invention.
Figure 6:
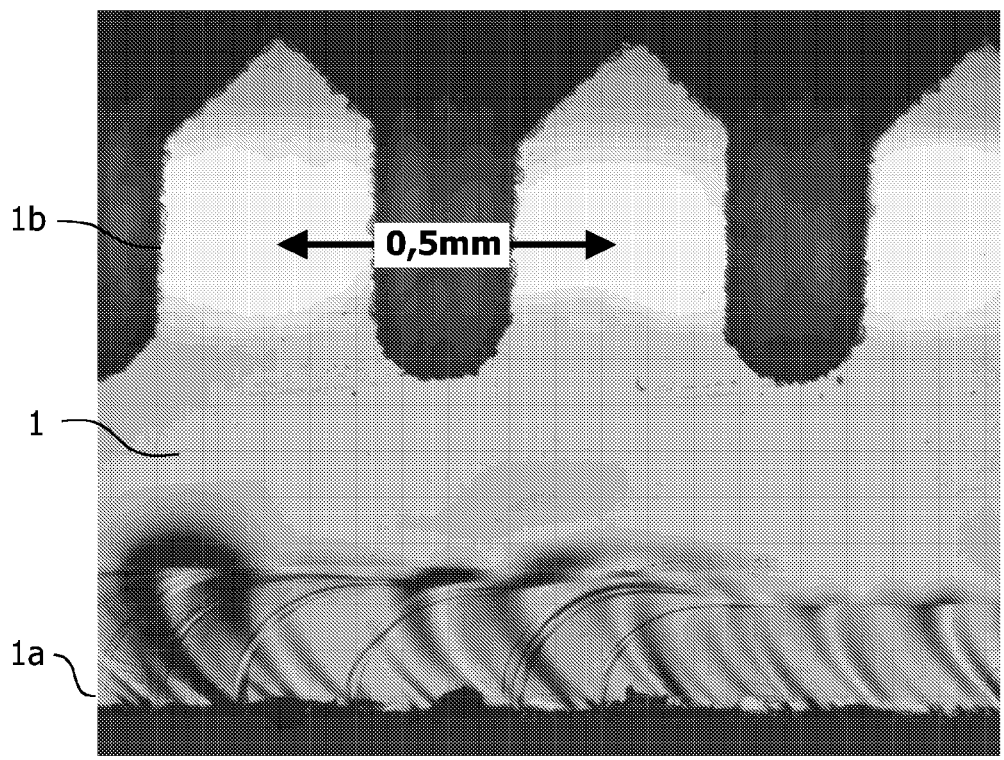
FIGS. 6 to 9 are microscope photographs showing, from the side, substrates according to the invention having elements of structure that are spaced different distances apart in plane of section A-B in FIG. 2
Figure 7:
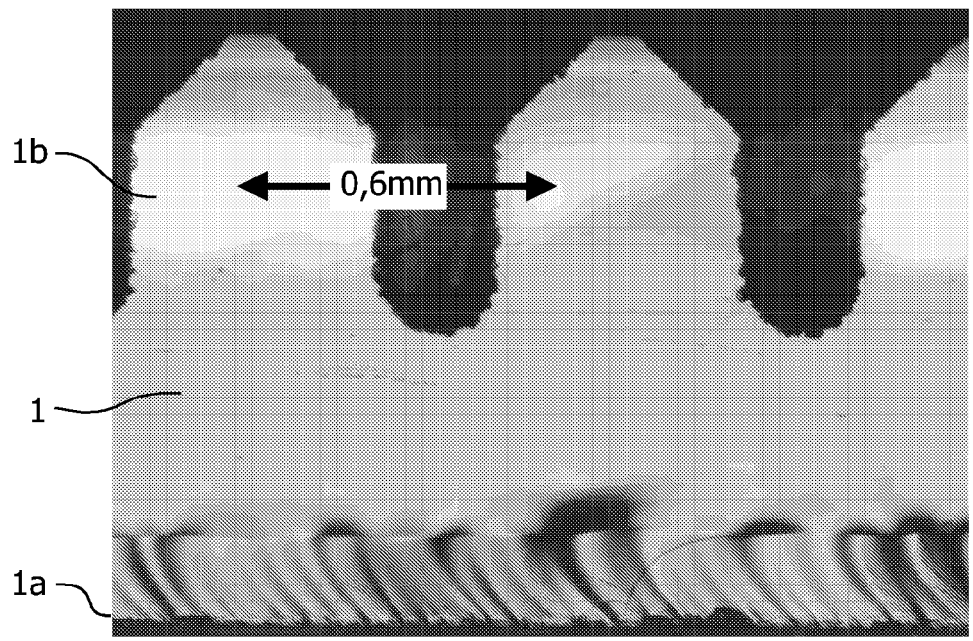

As shown in FIG. 5, an electroluminescent light source 20 according to the invention comprises a transparent substrate 1 according to the invention having a first planar surface 1a and a second structured surface 1b and, applied to the first surface 1a, a layered structure comprising at least one organic or inorganic electroluminescent layer 22 (EL layer) that is arranged between a transparent electrode 21 and an electrode 23. Depending on the form taken by the EL light source 20, the electrode 23 may be reflective, partly reflective or transparent. The EL layer 22 may be built up from a plurality of sub-layers. In the case of organic EL layers 22, an electron injection layer made of a material having a low work function may be arranged between the electrode 23, which is typically the cathode, and the EL layer 22, and an additional hole transport layer may be arranged between the electrode 21, which is typically the anode, and the EL layer 22. In what is termed a bottom-emitting EL light source 20, the light 6 reaches the observer through the substrate 1. In a further embodiment, in which, in addition to the emission through the substrate 1, the emission of light is also desired towards the side opposite from the substrate 1 (for what is termed a top-emitter), the electrode 23 is produced in a transparent form. In this embodiment, a further substrate 1 according to the invention may be applied in addition to the electrode 23, to give improved coupling-out of light.

A transparent electrode 21 may for example contain p-doped silicon, indium-doped tin oxide (ITO) or antimony-doped tin oxide (ATO). The transparent electrode 21 preferably contains ITO having a refractive index in the visible region of the spectrum of 1.6 to 2. A reflective electrode 23 may either be naturally reflective, being for example made of a material such as aluminum, copper, silver or gold, or may have in addition a reflective layered structure. If a reflective layer or layered structure is arranged below the electrode 23, looking in the direction of emission 6 of the light, the electrode 23 may also be transparent. The electrode 23 may be structured and may for example contain a plurality of parallel strips of the conductive material or materials. Alternatively, the electrode 23 may be unstructured and may take the form of a single, continuous area.

In addition to the layers shown in FIG. 5, an electroluminescent light source 20 may also include further layers, for matching the charge transfer properties for example, or layers for modifying the optical properties.

The substrate 1 according to the invention having a structured second surface 1b allows a layer for coupling out light that would otherwise be applied to the substrate as an addition, and hence all the process faults that are possible when the layer for coupling out light is applied to the substrate are avoided. Adhesion problems and the risk of the layer for coupling out light becoming detached during the operation of the EL light source are also avoided in this way.

Because the structure for coupling out light is produced in the second surface 1b of the substrate according to the invention, there is no interface between the substrate 1 and the structure for coupling out light (the second side 1b of the substrate). The substrate material that can be selected, and hence the refractive index that can be selected for the substrate, is thus no longer restricted by a material that has to be laminated on, typically plastics material having a refractive index of the order of 1.5. In a preferred embodiment, the substrate 1 according to the invention is therefore composed of a material having a refractive index n of 1.4<n<3. It is particularly advantageous if the refractive index of the substrate is higher than that of the transparent electrode 21. What are suitable for this purpose are for example highly refractive glasses. The closer the refractive index of the substrate comes to that of the transparent electrode, or even the higher than it that it becomes, the more will coupling-out losses due to total reflection at the interface between the transparent electrode 21 and the substrate 1 be avoided. As the same time as there is 100% coupling-in of light from the electrode 21 into the substrate 1, that proportion of the light that, after reflection and scattering at the substrate/air interface, strikes the first side 1a of the substrate at high angles of incidence will be kept in the substrate 1 by total reflection at the electrode/substrate interface and will be reflected again onto the second side 1b of the substrate to be coupled out. Due to the rough and structured second side 1b of the substrate, there is a high probability of this light being coupled out.

FIG. 6 to FIG. 9 show substrates 1 according to the invention made of glass that were produced with what is termed a dicing machine made by the Disco Corporation company. Parallel first depressions were first cut in a 1 mm thick glass substrate, planar on both sides, at a spacing of 0.5 mm (FIG. 6), 0.6 mm (FIG. 7), 0.7 mm (FIG. 8) and 1 mm (FIG. 9), followed by parallel second depressions of a width of 0.2 mm being cut at right angles to the first depressions. The depressions were then widened with a 90° dicing blade in the A1A series. Depending on the depth of cut, what were then formed were the desired structures for coupling out light, which in this case were in the form of truncated pyramids, having an advantageous proportional area where the sum of the areas of the second surfaces 4a were between 10% and 70% of the area of the first side 1a of the substrate. The unwidened depressions represented the third regions 7, having third surfaces 7a perpendicular to the first side 1a of the substrate, and having a floor forming a second region 4 having a second surface 4a, which in this case was in the form of a rough surface.

Figure 8:
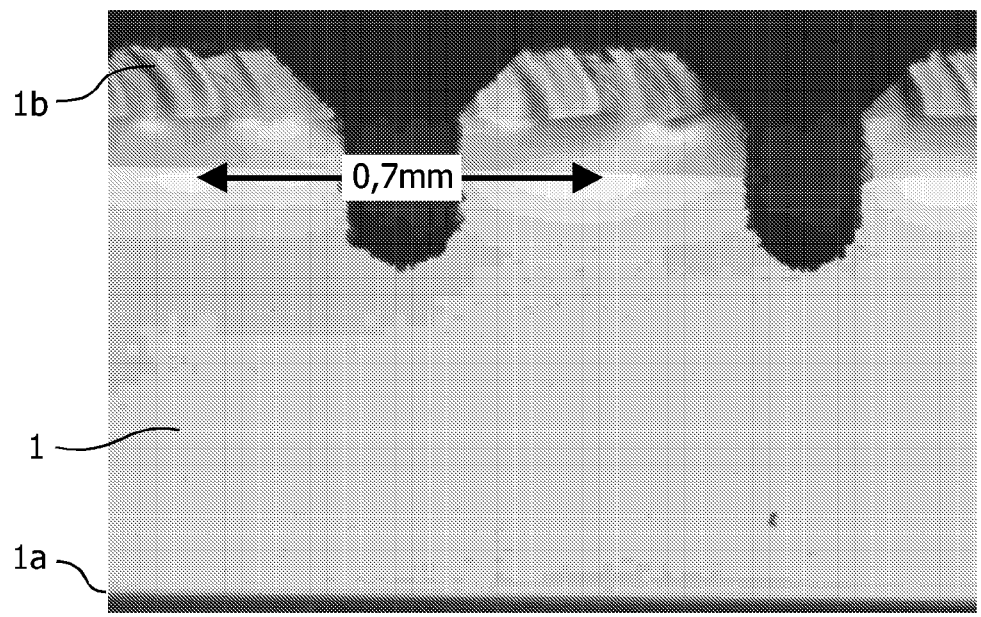
Figure 9:
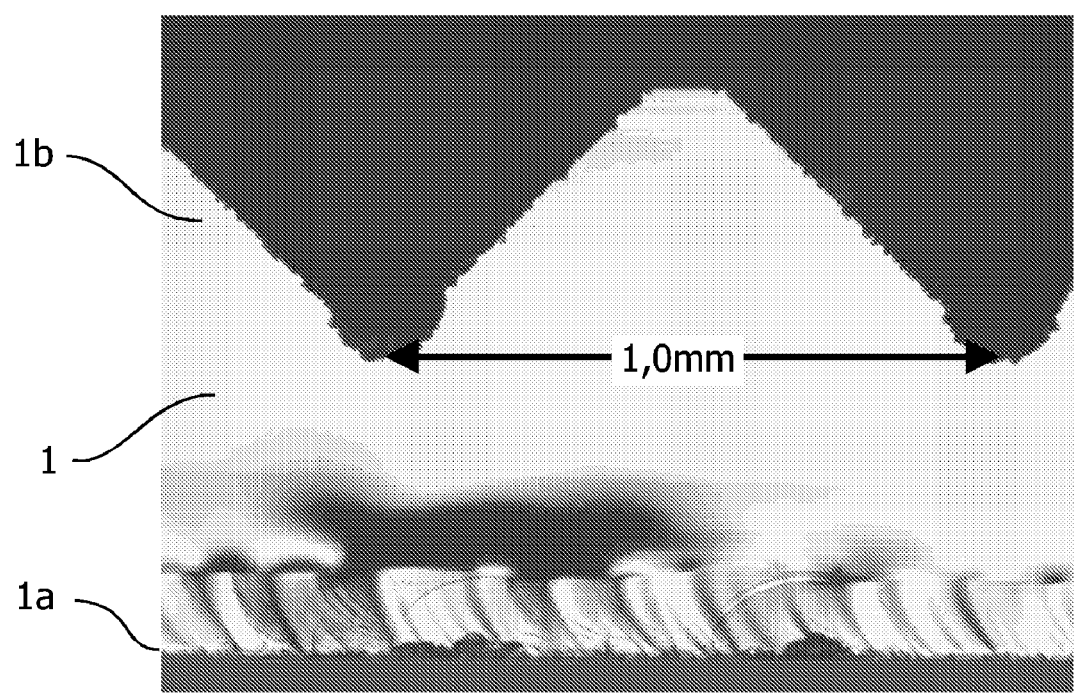

For these embodiments according to the invention, a maximum coupling-out of light, as measured in an Ulbricht sphere, was obtained with a spacing 5 between adjoining elements of structure 2 of 0.7 mm, see FIG. 8. Measurements of light yield showed, in comparison with a glass substrate that was planar on both sides, an improvement in light yield (improved coupling-out of light) of 51% (FIG. 8), 42% (FIG. 7) and 41% (FIG. 6) for the structured second surfaces 1b shown. At a spacing 5 of 1 mm, the increase in light yield was then only 40%, see FIG. 9.

The spacing between adjoining third side faces was determined in this case by the width of the sawing blade used. In other embodiments, this spacing may also be of other values.

The structured surface 1b of the transparent substrate can be sawn, milled or ground (where the substrates are made of glass for example) or else may be produced by casting or injection molding processes (in the case of plastics materials such as PMMA for example).

The embodiments that have been elucidated by means of the drawings and description are only examples illustrating the improvement of the coupling of light out of an electroluminescent light source and are not to be construed as limiting the claims to these examples. For the person skilled in the art, there are also alternative embodiments that are possible, and these too are covered by the scope of protection afforded by the claims. The numbering of the dependent claims is not intended to imply that other combinations of the claims do not also represent advantageous embodiments of the invention.

The invention claimed is:

1. A substrate comprising a planar first side for the application of an electroluminescent layered structure for emitting light, and a structured second side for the effective coupling of light out of the substrate, the structured second side comprising a plurality of elements arranged in a cyclically repetitive pattern, wherein centers of adjoining elements are at a spacing of between 0.1 mm and five times a thickness of the substrate, and each of the elements comprises first regions having first surfaces that have a surface roughness between 0.2 µm and 100 µm.

2. A substrate as claimed in claim 1, wherein the elements comprise second regions having a second surface substantially parallel to the first side of the substrate, and the first regions taper.

3. A substrate as claimed in claim 2, wherein the sum of the areas of all the second surfaces is between 10% and 70% of the area of the first side of the substrate.

4. A substrate as claimed in claim 2, wherein the first surfaces of the tapered first regions are at an angle of between 20 and 70° to the first side of the substrate.

5. A substrate as claimed in claim 1, wherein each of the elements comprises a pyramid.

6. A substrate as claimed in claim 1, wherein each of the elements comprises a third region having a third surface substantially perpendicular to the first side of the substrate, and having a surface roughness between 0.2 µm and 100 µm.

7. An electroluminescent light source, comprising:
a substrate comprising a planar first side and a structured second side, the structured second side comprising a plurality of elements arranged in a cyclically repetitive pattern, wherein centers of adjoining elements are at a spacing of between 0.1 mm and five times a thickness of the substrate, and each of the elements comprises first regions having first surfaces that have a surface roughness between 0.2 µm and 100 µm;
an electroluminescent layer;
a transparent electrode disposed between the substrate and the electroluminescent layer; and
an electrode disposed beneath the electroluminescent layer.

8. An electroluminescent light source as claimed in claim 7, wherein the substrate has a refractive index n of 1.4<n<3.

9. An electroluminescent light source as claimed in claim 8, wherein the refractive index of the substrate is higher than a refractive index of the transparent electrode.

* * * * *